United States Patent
Han

(10) Patent No.: US 8,823,047 B2
(45) Date of Patent: Sep. 2, 2014

(54) SEMICONDUCTOR LIGHT EMITTING DEVICE INCLUDING FIRST CONDUCTIVE TYPE CLAD LAYER

(75) Inventor: Sang Hoon Han, Gwangju (KR)

(73) Assignee: LG Innotek Co., Ltd., Seoul (KR)

(*) Notice: Subject to any disclaimer, the term of this patent is extended or adjusted under 35 U.S.C. 154(b) by 986 days.

(21) Appl. No.: 12/353,273

(22) Filed: Jan. 14, 2009

(65) Prior Publication Data
US 2009/0179221 A1    Jul. 16, 2009

(30) Foreign Application Priority Data
Jan. 15, 2008  (KR) .................. 10-2008-0004516

(51) Int. Cl.
*H01L 33/00*  (2010.01)
*H01L 33/02*  (2010.01)
*H01L 33/12*  (2010.01)
*H01L 33/32*  (2010.01)

(52) U.S. Cl.
CPC ............. *H01L 33/025* (2013.01); *H01L 33/12* (2013.01); *H01L 33/32* (2013.01)
USPC .................. 257/101; 257/103; 257/E33.028

(58) Field of Classification Search
USPC .............................. 257/94, 96, 97, 101, 103, 257/E33.026–E33.042; 438/37
See application file for complete search history.

(56) References Cited

U.S. PATENT DOCUMENTS

| | | | | |
|---|---|---|---|---|
| 5,173,913 A | * | 12/1992 | Kaneno ................... | 372/46.01 |
| 5,670,798 A | * | 9/1997 | Schetzina ................. | 257/96 |
| 6,515,313 B1 | * | 2/2003 | Ibbetson et al. .......... | 257/103 |

* cited by examiner

*Primary Examiner* — Laura Menz
*Assistant Examiner* — Candice Y Chan
(74) *Attorney, Agent, or Firm* — Birch, Stewart, Kolasch & Birch, LLP

(57) ABSTRACT

Provided is a semiconductor light emitting device. The semiconductor light emitting device comprises a first conductive type clad layer having a composition ratio of aluminum increased at a predetermined rate, an active layer on the first conductive type clad layer, and a second conductive type semiconductor layer on the active layer.

20 Claims, 5 Drawing Sheets

SEMICONDUCTOR LIGHT EMITTING DEVICE INCLUDING FIRST CONDUCTIVE TYPE CLAD LAYER

CROSS-REFERENCE TO RELATED APPLICATIONS

The present application claims priority under 35 U.S.C. 126 to Korean Patent Application No. 10-2008-0004516 (filed on Jan. 15, 2008), which is hereby incorporated by reference in its entirety.

BACKGROUND

The present disclosure relates to a semiconductor light emitting device.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an ID (laser diode), and studies have been continuously conducted to improve the manufacturing process or a light efficiency of the nitride semiconductor.

SUMMARY

Embodiments provide a semiconductor light emitting device, which can increase the band gap of a clad layer under an active layer.

Embodiments provide a semiconductor light emitting device, which comprises a clad layer having a composition ratio increased at a predetermined rate under an active layer.

An embodiment provides a semiconductor light emitting device comprising: a first conductive type clad layer comprising a composition ratio of aluminum increased at a predetermined rate; an active layer on the first conductive type clad layer; and a second conductive type semiconductor layer on the active layer.

An embodiment provides a semiconductor light emitting device comprising: a first conductive semiconductor layer; a first conductive type clad layer comprising a composition ratio of aluminum increased according to a growth thickness on the first conductive semiconductor layer; an active layer on the first conductive type clad layer; and a second conductive type clad layer on the active layer.

An embodiment provides a semiconductor light emitting device comprising: a first conductive semiconductor layer; a first conductive type clad layer comprising a first clad layer comprising a composition ratio of a aluminum increased at a predetermined rate on the first conductive semiconductor layer; an active layer on the first conductive type clad layer; and a second conductive type semiconductor layer on the active layer.

The details of one or more embodiments are set forth in the accompanying drawings and the description below. Other features will be apparent from the description and drawings, and from the claims.

DETAILED DESCRIPTION OF THE EMBODIMENTS

Hereinafter, a semiconductor light emitting device according to embodiments will be described with reference to the accompanying drawings.

In descriptions of the embodiments, it will be understood that when a layer (or film), a region, a pattern, or components is referred to as being 'on' or 'under' another substrate, layer (or film), region, or patterns, it can be directly on the other layer or substrate, or intervening layers may also be present. Also, in the descriptions of the embodiments, sizes of elements illustrated in drawings are one example, and the present disclosure is not limited to the illustrated drawings.

Figure 1:
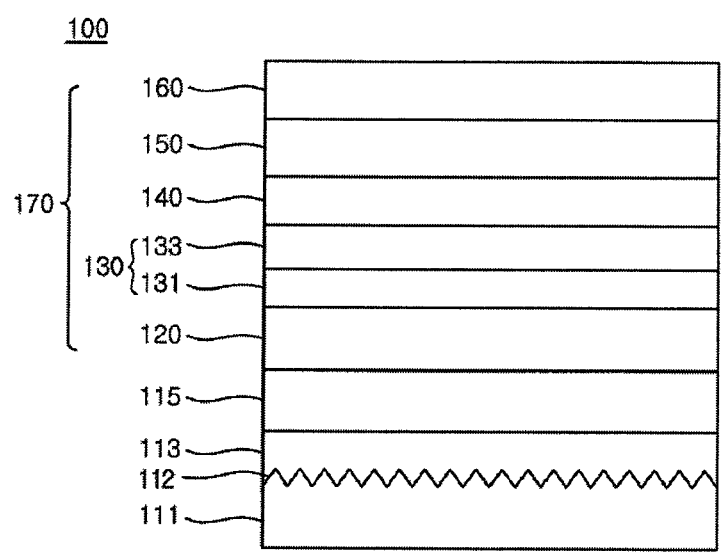
FIG. 1 is a side cross-sectional view of a semiconductor light emitting device according to a first embodiment.

FIG. 1 is a side cross-sectional view of a semiconductor light emitting device according to a first embodiment.

Referring to FIG. 1, a semiconductor light emitting device 100 comprises a substrate 111, a buffer layer 113, an undoped semiconductor layer 115, a first conductive type semiconductor layer 120, a first conductive type clad layer 130, an active layer 140, a second conductive type clad layer 150, and a second conductive type semiconductor layer 160.

The substrate 111 may selected from the group consisting of sapphire ($Al_2O_3$), GaN, SiC, ZnO, Si, GaP, and GaAs substrates. A predetermined concave-convex pattern 112 may be formed on the substrate 111. The concave-convex pattern 112 may have one of stripe, lens, cylindrical, and cone shapes, but is not limited thereto.

A nitride semiconductor is grown on the substrate 111. The growth equipment may comprise an E-beam evaporator, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus, but not limited thereto. The nitride semiconductor may be implemented using a compound semiconductor having a composition formula expressed by $In_yAl_xGa_{1-x-y}N$ (where, $0 \leq x \leq 1$, $0 \leq y \leq 1$, and $0 \leq x+y \leq 1$)

The buffer layer 113 may be formed on the substrate 111. The buffer layer 113 may reduce a lattice mismatch between a GaN material and a substrate material. The buffer layer 113 may be formed to have a predetermined thickness by selectively using GaN, InN, AlN, InGaN, AlGaN, InAlGaN, or AlInN.

The undoped semiconductor layer 115 may be formed on the buffer layer 113. The undoped semiconductor layer 115 may be implemented using an undoped GaN layer. Without being limited thereto, the buffer layer 113 and the undoped semiconductor layer 115 may not be formed on the substrate 111.

The first conductive type semiconductor layer 120 is formed on the undoped semiconductor layer 115. The first conductive type semiconductor layer 120 may be formed using the group III-V compound semiconductor doped with a first conductive type dopant. The first conductive type semiconductor layer 120 may be formed of semiconductor materials having a composition formula expressed by $In_xAl_yGa_{1-x-y}N$ (where, $0 \leq x \leq 1$, $0 \leq y \leq 1$, and $0 \leq x+y \leq 1$), e.g., InAlGaN, GaN, AlGaN, InGaN, AlN, InN, etc. When the first conductive type semiconductor layer 120 is an N-type semiconductor layer, the first conductive type dopant may comprise an N-type dopant such as Si, Ge, Sn, etc.

The first conductive type semiconductor layer 120 may be used as an electrode contact layer, and formed in a mono- or multi-layer.

The first conductive type clad layer 130 may be disposed on the first conductive type semiconductor layer 120. The first conductive type clad layer 130 may have a greater band gap than the active layer 140, and formed of a material having a small refractive index. The first conductive type clad layer 130 may serve as an electrode contact layer. In this case, the first conductive type semiconductor layer 120 may not be formed.

The first conductive type clad layer 130 may be formed of one of the group III-V compound semiconductors having Al, which is doped with the first conductive type dopant, e.g., AlGaN or AlInGaN. Hereinafter, for convenience of explanation, it is assumed that the first conductive type clad layer 130 is an AlGaN layer.

When the first conductive type clad layer 130 is the AlGaN layer, the AlGaN layer may be grown through supplying a carrier gas and an atmospheric gas at a predetermined growth temperature. The carrier gas may comprise a nitrogen and/or a hydrogen, and the atmospheric gas may comprise $NH_3$, TMGa (or TEGa), and TMAl. When the first conductive type clad layer 130 is an N-type semiconductor layer, the N-type semiconductor layer may be formed by supplying the N-type dopant.

The first conductive type clad layer 130 may comprise a first clad layer 131 and a second clad layer 133.

The first conductive type clad layer 130 may be formed by increasing the composition ratio of Al at a predetermined rate. The first clad layer 131 may be formed on the first conductive type semiconductor layer 130 by gradationally increasing the composition ratio of Al. The second clad layer 133 may be formed on the first clad layer 131 so as to have a constant composition ratio of Al. That is, the second glad layer 133 may be formed in the maximum composition ratio of Al, which has been gradationally increased in the formation of the first clad layer 131.

The first clad layer 131 may be formed by increasing the supply of the TMAl from a minimum value to a maximum value at a predetermined rate. That is, the composition ratio of Al in the AlGaN layer may be gradationally increased from the minimum value to the maximum value. The minimum composition ratio of Al is from about 0% to about 0.001%, and the maximum composition ratio is from about 40% to about 70%.

The composition ratio of Al in the first clad layer may be gradationally increased from about 0.001 to about 40% or 70% at a constant rate (e.g., by about 5% to about 10%). In this case, the composition ratio and content of Al in the AlGaN layer may represent an added volume of Al with respect to the total volume of the AlGaN layer.

The second clad layer 133 may formed in a constant ratio of Al without changing the maximum value of the supply of the TMAl in the first clad layer 131. The second clad layer 133 may be formed in a predetermined thickness (e.g. about 1 μm to about 3 μm) to remove a strain delivered through the first clad layer 131.

The second clad layer 133 may comprise the maximum composition ratio of Al, which may be the maximum composition ratio of Al in the first clad layer 131, or more.

The active layer 140 may be formed on the first conductive type clad layer 130. The active layer 140 may be formed of the group III-V compound semiconductor having a single or multiple quantum well structure. The active layer 140 may be formed of, e.g., InGaN/GaN or AlGaN/GaN, but not limited thereto.

The active layer 140 may comprise a material having a band gap energy according to the wavelength of an emitting light. For example, the active layer 140 may comprise a material emitting a color light such as a blue wavelength light, a red wavelength light, a green wavelength light, etc.

The second conductive type clad layer 150 may be formed on the active layer 140. The second conductive type clad layer 150 may be formed of AlGaN or AlInGaN doped with a second conductive type dopant. The second conductive type clad layer 150 may have a smaller refractive index and a greater band gap than the active layer 140.

The second conductive type semiconductor layer 160 may be formed on the second conductive type clad layer 150. The second conductive type semiconductor layer 160 may be formed of the group III-V compound semiconductor doped with the second conductive type dopant. The second conductive type semiconductor layer 160 may be selected from the group consisting of semiconductor materials having a composition formula expressed by $In_xAl_yGa_{1-x-y}N$ (where, $0 \leq x \leq 1$, $0 \leq y \leq 1$, $0 \leq x+y \leq 1$), e.g., InAlGaN, GaN, AlGaN, InGaN, AlN, InN, etc. When the second conductive type semiconductor layer 160 is a P-type semiconductor layer, the second conductive type dopant may comprise an N-type dopant such as Mg, Zn, Ca, Sr, Ba, etc.

In this case, the range from the first conductive type semiconductor layer 120 to the second conductive type semiconductor layer 160 may be defined as a light emitting structure. A third conductive type semiconductor layer (not shown) and/or a transparent electrode layer (not shown) may be formed on the second conductive type semiconductor layer 160. The third conductive type semiconductor layer may be implemented using a semiconductor layer doped with a first conductive type dopant. The light emitting structure 170 may be formed using one of N—P junction, P—N junction, N—P—N junction and P—N—P junction structures, which may be modified within the technical range of the embodiment.

The semiconductor light emitting device 100 can reduce the lattice mismatch with GaN by disposing a first conductive type clad layer 130 under the active layer 140.

The first conductive type clad layer 130 may remove a crack delivered to the active layer 140, and provide a layer having a high band gap. Accordingly, a light having a high wavelength band can be obtained in the active layer 140. Also, the reliability can be improved according to the increase of the band gap.

Additionally, the first clad layer 131 can improve the characteristics of reverse breakdown voltage and electrostatic discharge (e.g., by about 30%).

Figure 2:
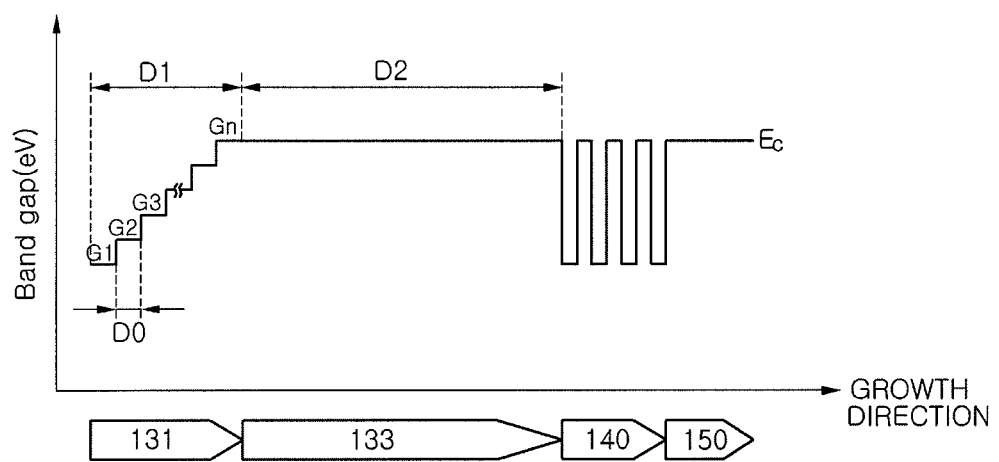
FIG. 2 is a band diagram of a first conductive type clad layer according to the first embodiment.

FIG. 2 is a band diagram of a first conductive type clad layer according to the first embodiment.

Referring to FIG. 2, a first clad layer 131 may be grown into N layers (e.g., about 8 to 16 layers) by increasing the composition ratio of Al at a constant rate (e.g., about 5 to 10%) from the minimum value thereof.

When the composition ratio of Al in the first clad layer 131 is increased, e.g., by 10%, a first AlGaN layer G1 to an N-th AlGaN layer Gn may be sequentially formed. In this case, the first AlGaN layer G1 may be formed to have the composition ratio of about $000.1\% < Al \leq 10\%$. The second AlGaN layer G2 may be formed to have the composition ratio of about 10%

≤Al≤20%. The third AlGaN layer G3 may be formed to have the composition ratio of about 20% <Al≤30%. The N-th AlGaN layer Gn may be formed to have the composition ratio of about 60% <Al≤70%.

The first clad layer 131 may be formed to have a thickness D1 of from about 700 Å to about 1200 Å, and each AlGaN layer may be formed to have a thickness D0 of from about 100 Å to about 200 Å. Without being limited thereto, the thicknesses of AlGaN layers G1 to Gn may be different from each other within the range from about 100 Å to about 200 Å.

The first clad layer 131 can reduce a lattice defect, by gradationally increasing the composition ratio of Al with respect to the total content at a constant rate (e.g., about 5% to 10%), and also increase the band gap of the first conductive type clad layer gradationally.

The second clad layer 133 may be formed to have a predetermined thickness and the maximum composition ratio of Al (e.g., about 40% to about 70%). The second clad layer 133 may be formed to have the constant composition ratio of Al, e.g., within the range from about 40% to about 70%, which is the maximum value of Al content. In this case, the second clad layer 133 may be formed to have a thickness D2 of about 1 μm to about 3 μm.

Figure 3:
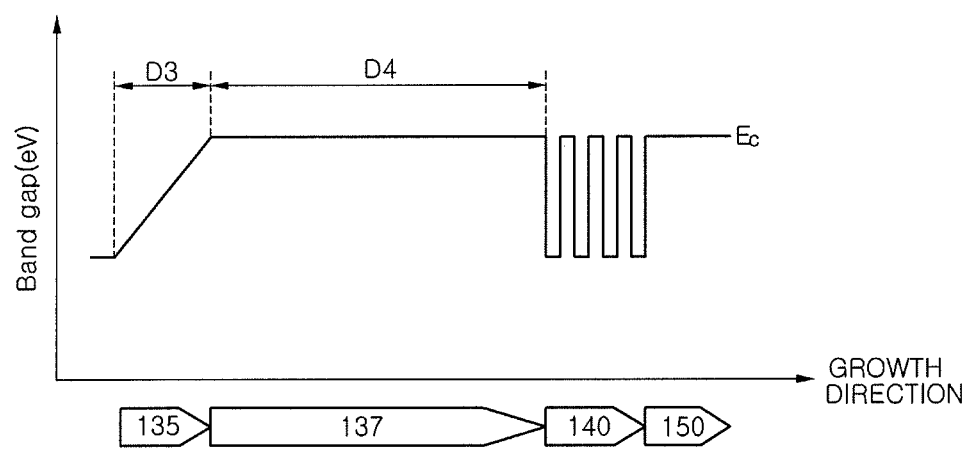
FIG. 3 is a band diagram of a first conductive type clad layer according to a second embodiment.

FIG. 3 is a band diagram of a first conductive type clad layer according to a second embodiment.

Referring to FIG. 3, a first clad layer 135 of a first conductive type clad layer 135 and 137 may be formed by linearly increasing the composition ratio of Al from the minimum value to the maximum value thereof. The composition ratio of Al may be linearly increased in proportion to the growth time of the first clad layer 135. In this case, the minimum value of the composition ratio of Al may be 0 or about 0.001%, the maximum value thereof may be from about 40% to about 70% with respect to the total content.

The first clad layer 135 may be formed by linearly increasing the composition ratio of Al from about 0.001% to about 40%~70%. The second clad layer 137 may be formed on the first clad layer 135.

The second clad layer 137 may be formed to have a composition ratio of Al within the range of the maximum value of the composition ratio of Al in the first clad layer. The second clad layer 137 may be formed to have the finally-grown maximum value of the composition ratio of Al in the first clad layer 135. In this case, the composition ratio of Al in the second clad layer 137 may be identical to or greater than the finally-grown composition ratio of Al in the first clad layer 135.

The first clad layer 135 may be to have a thickness D3 from about 700 Å to about 1,200 Å, and the second clad layer 137 may be formed to have a thickness D4 of about 1 μm to about 3 μm. The second clad layer 137 may remove a strain delivered from the first clad layer 135.

Figure 4:
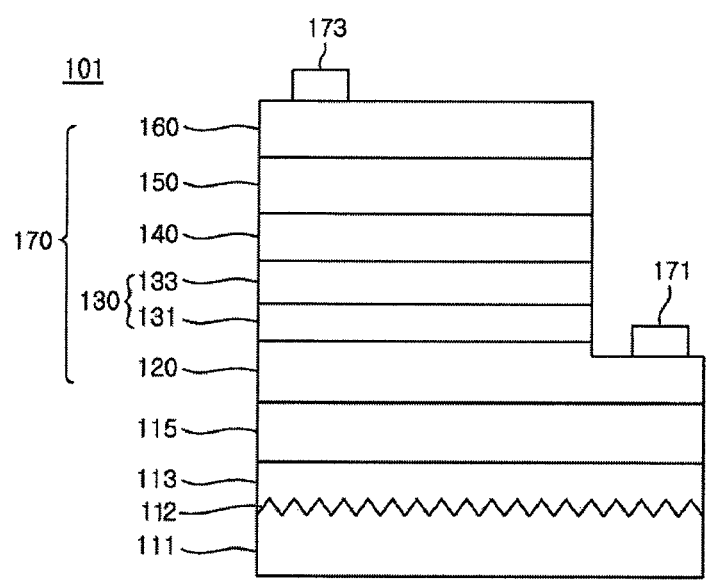
FIG. 4 is a side cross-sectional view of a horizontal-type semiconductor light emitting device manufactured using the semiconductor light emitting device in FIG. 1.

FIG. 4 is a side cross-sectional view of a horizontal-type semiconductor light emitting device manufactured using the semiconductor light emitting device in FIG. 1. Parts identical to those in FIG. 1 will be referred to by the same numerals, and detail description thereof will be omitted hereinafter.

Referring to FIG. 4, a semiconductor light emitting device 101 may expose a portion of the first conductive type semiconductor layer 120 through a mesa etching process. A first electrode layer 171 may be formed on the portion of the first conductive type semiconductor layer 120, and a second electrode layer 173 having a predetermined pattern may be formed on the second conductive type semiconductor layer 160.

When a transparent electrode layer (not shown) is formed on the second conductive type semiconductor layer 160, the second electrode layer 174 may be formed on at least one of the second conductive type semiconductor layer 160 and the transparent electrode layer (not shown).

Also, the first clad layer 131 of the first conductive type clad layer 130 can improve the characteristics of reverse breakdown voltage and electrostatic discharge (e.g., by about 30%)

Figure 5:
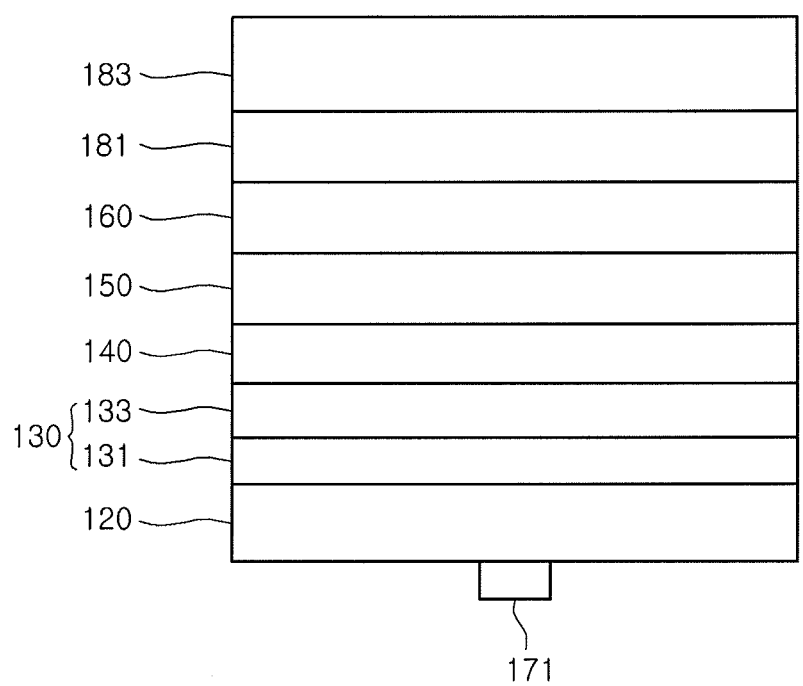
FIG. 5 is a side cross-sectional view of a vertical-type semiconductor light emitting device manufactured using the semiconductor light emitting device in FIG. 1.

FIG. 5 is a side cross-sectional view of a vertical-type semiconductor light emitting device manufactured using the semiconductor light emitting device in FIG. 1.

Referring to FIG. 5, a semiconductor light emitting device 103 may further comprise an electrode layer 181 formed on the second conductive type semiconductor layer 160, and a conductive supporting member 183 formed on the electrode layer 181.

The electrode layer 181 may be selectively formed of a reflecting electrode material, e.g., Al, Ag, Pd, Rh, Pt, or an alloy thereof. The conductive supporting member 183 may be formed of Cu, Au, carrier waver (e.g., Si, Ge, GaAs, ZnO, etc), etc. An ohmic contact layer (e.g., ITO, IZO, AZO, etc) can be formed to have a predetermined pattern between the electrode layer 181 and the second conductive type semiconductor layer 160.

When the conductive supporting member 183 is formed, the substrate 111, the buffer layer 113, and the updoped semiconductor layer 115 may be removed through physical and/or chemical processes. A first electrode layer 171 is formed under the first conductive type semiconductor layer 120.

Although a compound semiconductor light emitting device comprising an N—P junction structure is used in the embodiments, the present disclosure should not be construed as limited thereto. For example, a compound semiconductor light emitting device comprising N—P—N, P—N, and P—N—P junction structures may be used.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A semiconductor light emitting device, comprising:
   a first conductive type clad layer comprising a first clad layer comprising at least a first layer, a second layer on the first layer, and a third layer on the second layer,
   wherein the first clad layer has an aluminum composition ratio which is increased by a step graded increment in an order from the first layer of the first clad layer to an uppermost layer of the first clad layer, and wherein the first clad layer is a step graded layer;

an active layer on the first conductive type clad layer; and a second conductive type semiconductor layer on the active layer;

wherein the first conductive type clad layer comprises a second clad layer which is provided between the first clad layer and the active layer, wherein the second clad layer has an aluminum composition ratio, wherein the aluminum composition ratio of the second clad layer is approximately equal to an aluminum composition ratio of the uppermost layer of the first clad layer, and wherein the second clad layer is thicker than the first clad layer.

2. The semiconductor light emitting device according to claim 1, wherein the first conductive type clad layer comprises AlGaN or AlInGaN comprising a first conductive type dopant.

3. The semiconductor light emitting device according to claim 1, wherein the second clad layer is in contact with the uppermost layer of the first clad layer, wherein the aluminum composition ratio of the second clad layer is a substantially constant value.

4. The semiconductor light emitting device according to claim 3, wherein the second clad layer has an approximate thickness between 1 μm and 3 μm.

5. The semiconductor light emitting device according to claim 1, wherein the step graded increment of the aluminum composition ratio is in an approximate range between 5% increment and 10% increment, and wherein the aluminum composition ratio of the uppermost layer of the first clad layer is in an approximate range between 40% and 70%.

6. The semiconductor light emitting device according to claim 1, comprising at least one of a first conductive type semiconductor layer, an undoped semiconductor layer, a buffer layer, and a substrate under the first conductive type clad layer.

7. The semiconductor light emitting device according to claim 1, comprising a second conductive type clad layer between the active layer and the second conductive type semiconductor layer.

8. The semiconductor light emitting device according to claim 1, comprising a first electrode layer under the first conductive type clad layer; a second electrode layer on the second conductive type semiconductor layer; and a conductive supporting member on the second electrode layer.

9. The semiconductor light emitting device according to claim 1, comprising a substrate comprising a concave-convex pattern under the first conductive type clad layer.

10. The semiconductor light emitting device according to claim 1, wherein each layer of the first clad layer has an approximate thickness between 100 Å and 200 Å.

11. The semiconductor light emitting device according to claim 1, wherein the first clad layer has an approximate thickness between 700 Å and 1200 Å.

12. The semiconductor light emitting device according to claim 1, further comprising a third conductive type semiconductor layer on the second conductive type semiconductor layer, wherein the third conductive type semiconductor layer and the first conductive type clad layer comprise a first conductive type dopant.

13. The semiconductor light emitting device according to claim 1, wherein the first conductive type clad layer has a smaller refractive index than the active layer.

14. A semiconductor light emitting device, comprising:

a first conductive type semiconductor layer;

a first conductive type clad layer on the first conductive type semiconductor layer, wherein the first conductive type clad layer comprises a first clad layer including a multi-layer comprising at least a first layer, a second layer on the first layer, and a third layer on the second layer, wherein the first conductive type clad layer is an AlGaN based layer, wherein the first clad layer has a bandgap which is increased by a step graded increment in an order from the first layer of the first clad layer to an uppermost layer of the first clad layer, wherein the first clad layer is a step graded layer, wherein the first conductive type clad layer comprises a second clad layer on the first clad layer, wherein the second clad layer has a bandgap, wherein the bandgap of the second clad layer is approximately equal to a bandgap of the uppermost layer of the first clad layer, and wherein the second clad layer is thicker than the first clad layer;

an active layer on the second clad layer; and a second conductive type semiconductor layer on the active layer.

15. The semiconductor light emitting device according to claim 14, wherein each layer of the multi-layer of the first clad layer has an approximate thickness between 100 Å and 200 Å.

16. The semiconductor light emitting device according to claim 14, wherein the first clad layer has an approximate thickness between 700 Å and 1200 Å.

17. The semiconductor light emitting device according to claim 14, further comprising:

a substrate under the first conductive type semiconductor layer and having a concave-convex pattern.

18. The semiconductor light emitting device according to claim 14, wherein the second clad layer has an approximate thickness between 1 μm and 3 μm.

19. A semiconductor light emitting device, comprising:

a first conductive type clad layer comprising a first clad layer including a multi-layer comprising at least a first layer, a second layer directly on the first layer, and a third layer directly on the second layer, wherein the first clad layer has an aluminum composition ratio which is increased by a step graded increment in an order from the first layer of the first clad layer to an uppermost layer of the first clad layer, wherein the first clad layer is a step graded layer, wherein the first clad layer has a predetermined thickness, wherein the first conductive type clad layer comprises a second clad layer which is provided between the first clad layer and the active layer, wherein the second clad layer has an aluminum composition ratio, wherein the aluminum composition ratio of the second clad layer is approximately equal to an aluminum composition ratio of the uppermost layer of the first clad layer, and wherein the second clad layer is 8 to 43 times thicker than the first clad layer;

an active layer on the first conductive type clad layer; and a second conductive type semiconductor layer on the active layer.

20. The semiconductor light emitting device according to claim 19, further comprising a second conductive type clad layer between the active layer and the second conductive type semiconductor layer.

* * * * *